(12) United States Patent
Koresawa et al.

(10) Patent No.: US 10,574,231 B2
(45) Date of Patent: Feb. 25, 2020

(54) SENSOR FOR DETECTING TARGET IN NON-CONTACT MANNER AND SWITCH INCLUDING THE SAME

(71) Applicant: Panasonic Intellectual Property Management Co., Ltd., Osaka (JP)

(72) Inventors: Kouhei Koresawa, Kyoto (JP); Gosuke Sakamoto, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 405 days.

(21) Appl. No.: 15/405,403

(22) Filed: Jan. 13, 2017

(65) Prior Publication Data

US 2017/0214400 A1    Jul. 27, 2017

(30) Foreign Application Priority Data

Jan. 27, 2016    (JP) .................. 2016-013790

(51) Int. Cl.
*H03K 17/955* (2006.01)
*G01D 5/24* (2006.01)
*H03K 17/96* (2006.01)

(52) U.S. Cl.
CPC ............ *H03K 17/955* (2013.01); *G01D 5/24* (2013.01); *G01D 5/2405* (2013.01);
(Continued)

(58) Field of Classification Search
CPC ............... H03K 17/955; H03K 17/962; H03K 2217/960705; H03K 2017/9615; H03K 2217/960765; G01D 5/2405; G01D 5/24
See application file for complete search history.

(56) References Cited

U.S. PATENT DOCUMENTS

| 2009/0101417 A1* | 4/2009 | Suzuki | ................. G06F 3/0418 |
| | | | 178/18.06 |
| 2010/0231238 A1* | 9/2010 | Toyota | ................. G01D 5/2405 |
| | | | 324/662 |

(Continued)

FOREIGN PATENT DOCUMENTS

| JP | 2008-004465 | 1/2008 |
| JP | 2008-141329 | 6/2008 |

(Continued)

*Primary Examiner* — Jared Fureman
*Assistant Examiner* — Michael J Warmflash
(74) *Attorney, Agent, or Firm* — McDermott Will & Emery LLP

(57) ABSTRACT

A sensor for detecting a target in a non-contact manner includes a first electrode; a second; a third electrode that is disposed between the first electrode and the second electrode; and a determination circuit that, in operation, detects entry of the target into a first region by detecting a change of first electrostatic capacitance, which is electrostatic capacitance of the first electrode, and detects entry of the target into a second region by detecting a change of second electrostatic capacitance, which is electrostatic capacitance of the second electrode. An electric potential of the third electrode is more negative than electric potentials of the first electrode and the second electrode. At least a part of the second region at least partially surrounds an outer edge of the first region in plan view.

18 Claims, 17 Drawing Sheets

(52) U.S. Cl.
CPC ... *H03K 17/962* (2013.01); *H03K 2017/9615* (2013.01); *H03K 2217/960705* (2013.01); *H03K 2217/960765* (2013.01)

(56) References Cited

U.S. PATENT DOCUMENTS

| | | | | |
|---|---|---|---|---|
| 2010/0292945 | A1* | 11/2010 | Reynolds | G06F 3/044 |
| | | | | 702/65 |
| 2012/0139870 | A1* | 6/2012 | Beyly | G06F 3/0416 |
| | | | | 345/174 |
| 2012/0280698 | A1* | 11/2012 | Oya | G06F 3/03547 |
| | | | | 324/658 |
| 2015/0123682 | A1* | 5/2015 | Burger | G06F 3/044 |
| | | | | 324/688 |

FOREIGN PATENT DOCUMENTS

| | | |
|---|---|---|
| JP | 2009-111996 | 5/2009 |
| JP | 2010-212145 | 9/2010 |

\* cited by examiner

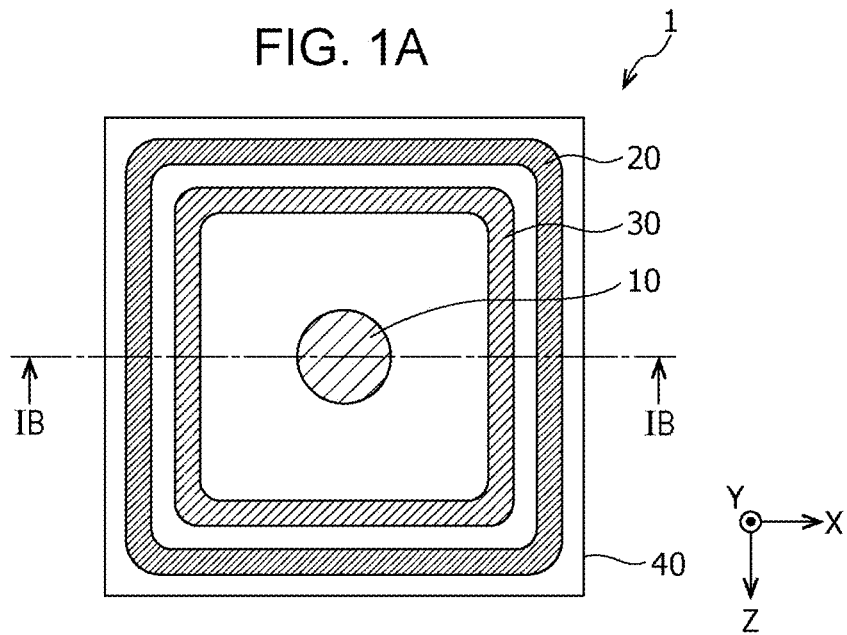
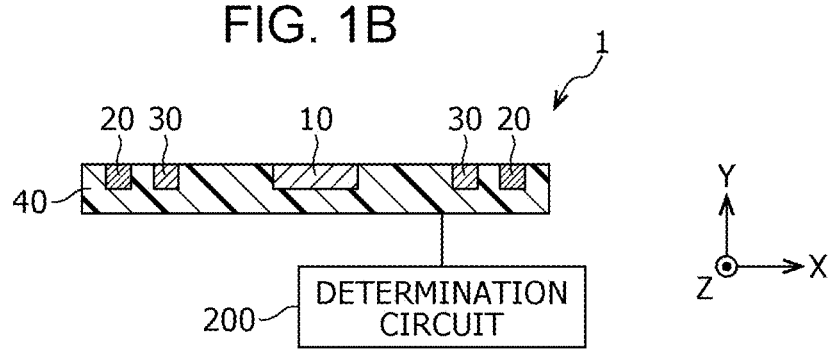

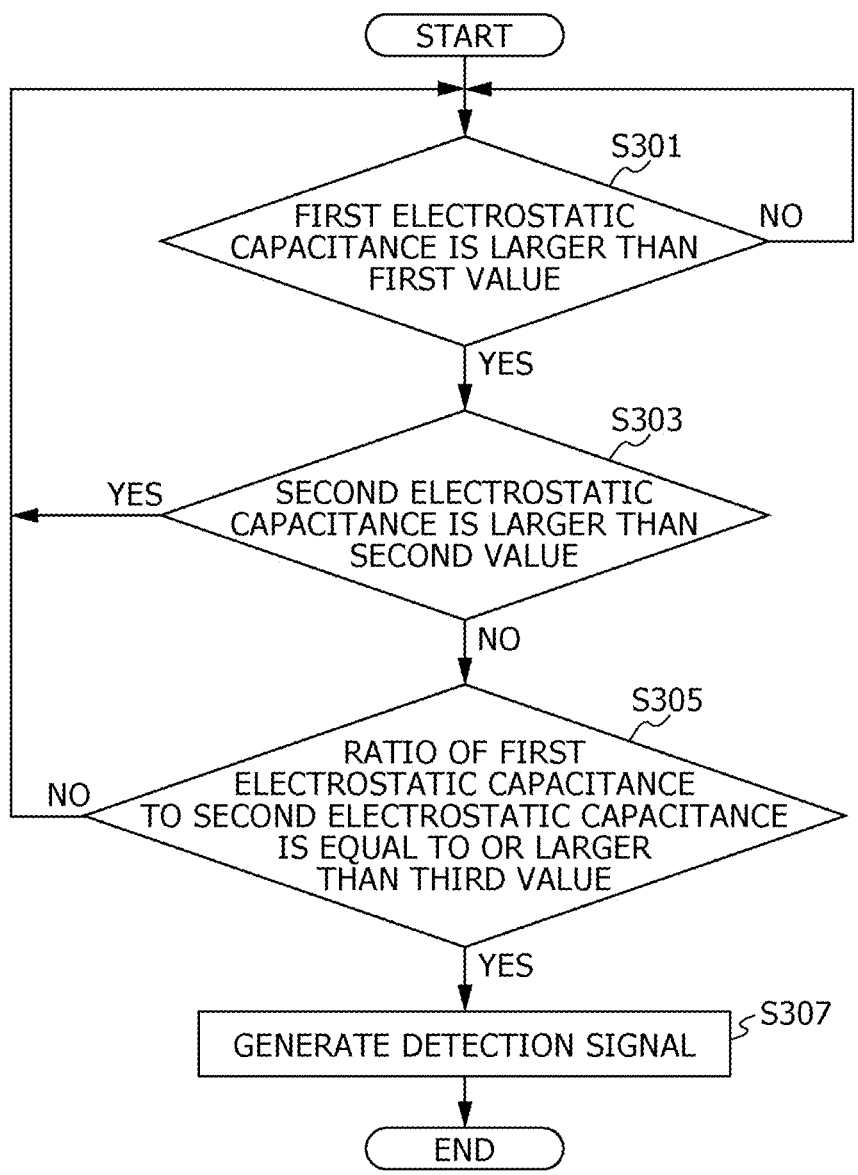

SENSOR FOR DETECTING TARGET IN NON-CONTACT MANNER AND SWITCH INCLUDING THE SAME

BACKGROUND

1. Technical Field

The present disclosure relates to a sensor for detecting a target in a non-contact manner and a switch including the sensor.

2. Description of the Related Art

Conventionally, a sensor is used in an operating switch for a user's operation such as an operation of turning an apparatus on or off. As this kind of sensor, a capacitance-type sensor utilizing electrostatic capacitance is known. For example, Japanese Unexamined Patent Application Publication No. 2009-111996 discloses a capacitance-type contact sensor (touch sensor).

The contact sensor disclosed in Japanese Unexamined Patent Application Publication No. 2009-111996 includes an operating switch, which is a first contact sensor unit, a dummy switch, which is a second contact sensor unit disposed close to the operating switch, and a sensor detection unit that detects whether or not effective contact has been made with the operating switch on the basis of output of the dummy switch. In this contact sensor, while the dummy switch is detecting user's contact, output of the operating switch is made ineffective even if the operating switch is detecting user's contact. In this way, only intentional contact is made effective. This makes it possible to prevent the contact sensor from reacting to an operation that is not intended by the user.

SUMMARY

In one general aspect, the techniques disclosed here feature a sensor for detecting a target in a non-contact manner, including a first electrode; a second electrode; a third electrode that is disposed between the first electrode and the second electrode; and a determination circuit that, in operation, detects entry of the target into a first region by detecting a change of first electrostatic capacitance, which is electrostatic capacitance of the first electrode, and detects entry of the target into a second region by detecting a change of second electrostatic capacitance, which is electrostatic capacitance of the second electrode. An electric potential of the third electrode is more negative than electric potentials of the first electrode and the second electrode. At least a part of the second region at least partially surrounds an outer edge of the first region in plan view.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1A is a plan view of a non-contact sensor according to Embodiment 1;

FIG. 1B is a cross-sectional view of the non-contact sensor according to Embodiment 1 taken along line IB-IB of FIG. 1A;

FIG. 21 is a flowchart illustrating an example of processing of the determination circuit of the non-contact sensor according to Embodiment 1.

DETAILED DESCRIPTION

Figure 2A:
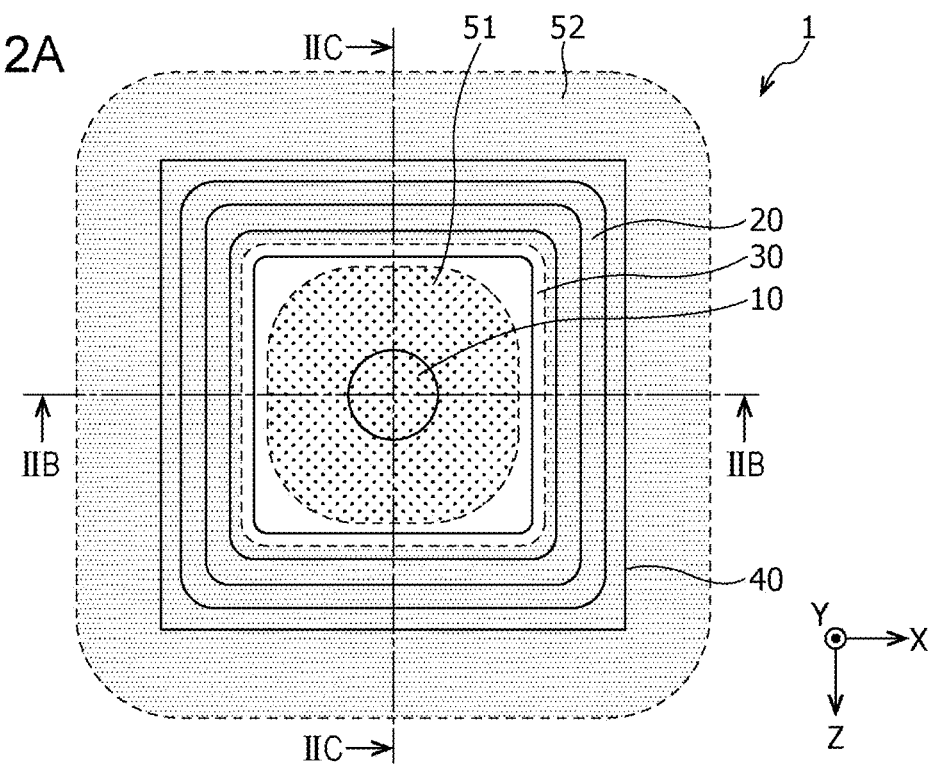
FIG. 2A is a diagram schematically illustrating a distribution of a first detection region and a second detection region in plan view in the non-contact sensor according to Embodiment 1.

The technique disclosed in Japanese Unexamined Patent Application Publication No. 2009-111996 is effective as a contact sensor that detects a target such as a user's hand on the basis of contact of the target, but is not effective in a case of a non-contact sensor that detects a target in a non-contact manner, and therefore cannot prevent the non-contact sensor from reacting to an operation that is not intended by a user.

For example, in a case where the technique disclosed in Japanese Unexamined Patent Application Publication No. 2009-111996 is applied to a non-contact sensor, a detection range of the operating switch is included in a detection range of the dummy switch. Accordingly, when a user brings his or her hand close to the operating switch, the hand is detected not only by the operating switch, but also by the dummy switch. That is, all operations are made ineffective.

Meanwhile, a sensor according to one aspect of the present disclosure makes it possible to prevent a sensor that detects a target in a non-contact manner from reacting to an operation that is not intended by a user.

The present disclosure includes at least a sensor and a switch described in the following items.

[Item 1]

A sensor according to Item 1 of the present disclosure is a sensor for detecting a target in a non-contact manner, including:

a first electrode;

a second electrode;

a third electrode that is disposed between the first electrode and the second electrode; and a determination circuit that, in operation, detects entry of the target into a first region by detecting a change of first electrostatic capacitance, which is electrostatic capacitance of the first electrode, and detects entry of the target into a second region by detecting a change of second electrostatic capacitance, which is electrostatic capacitance of the second electrode.

An electric potential of the third electrode is more negative than electric potentials of the first electrode and the second electrode.

At least a part of the second region at least partially surrounds an outer edge of the first region in plan view.

In the sensor according to Item 1, the determination circuit may include a processing circuitry and a memory storing a program, and the program, when executed by the processing circuitry, may cause the detection circuit to detect entry of the target into the first region by detecting a change of the first electrostatic capacitance and detect entry of the target into the second region by detecting a change of the second electrostatic capacitance.

[Item 2]

In the sensor according to Item 1, the second region may continuously and fully surround the outer edge of the first region in plan view.

[Item 3]

In the sensor according to Item 2, in first cross sectional view cutting the first and second electrodes, a first cross section of the first region may be located between two first cross sections of the second region; and in second cross sectional view cutting the first and second electrodes and orthogonal to the first cross sectional view, a second cross section of the first region may be located between two second cross sections of the second region.

[Item 4]

In the sensor according to Item 1, the second region may surround a half or more of the outer edge of the first region in plan view.

[Item 5]

In the sensor according to Item 4, in first cross sectional view cutting the first and second electrodes, a first cross section of the first region may be located between two first cross sections of the second region; and in second cross sectional view cutting the first and second electrodes and orthogonal to the first cross sectional view, a second cross section of the second region may be located on one side of a second cross section of the first region.

[Item 6]

In the sensor according to Item 1, a plurality of second electrodes may be provided in the sensor, each of the plurality of second electrodes being the second electrode;

the determination circuit may, in operation, detect entry of the target into a plurality of second regions by detecting a change of electrostatic capacitance of the plurality of second electrodes, each of the plurality of second regions being the second region; and the plurality of second regions may surround the outer edge of the first region in plan view. The plurality of second regions may surround the outer edge of the first region with a space between adjacent second regions in the plurality of second regions in plan view.

[Item 7]

In the sensor according to Item 6, in cross sectional view taken on a first cross section, a first cross section of the first region may be located between two first cross sections of two of the plurality of second regions; and in cross sectional view taken on a second cross section orthogonal to the first cross section, a second cross section of the first region may be located between two second cross sections of two of the plurality of second regions.

[Item 8]

In the sensor according to any one of Items 1 through 7, the determination circuit may generate a detection signal indicating that the target is detected, when the first electrostatic capacitance is larger than a first value and the second electrostatic capacitance is not larger than a second value; and the determination circuit may not generate the detection signal, when the first electrostatic capacitance is larger than the first value and the second electrostatic capacitance is larger than the second value.

In the sensor according to Item 8, the determination circuit may include a processing circuitry and a memory storing a program, and the program, when executed by the processing circuitry, may cause the detection circuit to generate the detection signal, when the first electrostatic capacitance is larger than the first value and the second electrostatic capacitance is not larger than the second value.

The detection signal is a signal indicating that a target has been detected by a sensor.

[Item 9]

In the sensor according to any one of Items 1 through 7, the determination circuit may generate a detection signal indicating that the target is detected, when the first electrostatic capacitance is larger than a first value, the second electrostatic capacitance is not larger than a second value, and a ratio of the first electrostatic capacitance to the second electrostatic capacitance is equal to or larger than a third value.

in the sensor according to Item 9, the determination circuit may include a processing circuitry and a memory storing a program, and the program, when executed by the processing circuitry, may cause the detection circuit to generate the detection signal, when the first electrostatic capacitance is larger than the first value, the second electrostatic capacitance is not larger than the second value, and the ratio is equal to or larger than the third value.

[Item 10]

In the sensor according to any one of Items 1 through 7, the determination circuit may generate a detection signal indicating that the target is detected, when the first electrostatic capacitance is larger than a first value and a ratio of the first electrostatic capacitance to the second electrostatic capacitance is equal to or larger than a third value.

In the sensor according to Item 10, the determination circuit may include a processing circuitry and a memory storing a program, and the program, when executed by the processing circuitry, may cause the detection circuit to generate the detection signal, when the first electrostatic capacitance is larger than the first value and the ratio is equal to or larger than the third value.

[Item 11]

In the sensor according to any one of Items 1 through 10, a height from a surface of the sensor to a tip of a cross section of the second region may be larger than a height from the surface of the sensor to a tip of a cross section of the first region in cross sectional view.

[Item 12]

In the sensor according to any one of Items 1 through 11, the electric potential of the third electrode may be a ground electric potential.

[Item 13]

In the sensor according to any one of Items 1 through 12, the first region and the second region may partially overlap each other in plan view.

[Item 14]

A switch according to Item 14 of the present disclosure is a switch for operating an apparatus, including:

a sensor according to any one of Items 1 through 13; and
a controller that, in operation, generates an operation signal for operating the apparatus on the basis of a detection signal supplied from the sensor. A sensor according to Item 15 of the present disclosure is a sensor for detecting a target in a non-contact manner, the sensor including: a first electrode; a second electrode; a third electrode that is disposed between the first electrode and the second electrode and fully surrounds the first electrode in plan view; and a determination circuit that, in operation, detects entry of the target into a first region by detecting a change of first electrostatic capacitance, which is electrostatic capacitance of the first electrode, and detects entry of the target into a second region by detecting a change of second electrostatic capacitance, which is electrostatic capacitance of the second electrode, wherein: an electric potential of the third electrode is more negative than electric potentials of the first electrode and the second electrode, and the second electrode at least partially surrounds the third electrode. In the sensor according to Item 15, the first to third electrode may be configured such that the second region does not overlap the first region in plan view.

In the present disclosure, all or a part of any of circuit, unit, device, part or portion, or any of functional blocks in the block diagrams may be implemented as one or more electronic circuits including, but not limited to, a semiconductor device, a semiconductor integrated circuit (IC) or a large scale integration (LSI). The LSI or IC can be integrated into one chip, or also can be a combination of plural chips. For example, functional blocks other than a memory may be integrated into one chip. The name used here is LSI or IC, but it may also be called system LSI, very large scale integration (VLSI), or ultra large scale integration (ULSI) depending on the degree of integration. A field programmable gate array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the circuit, unit, device, part or portion are implemented by executing software. In such a case, the software is recorded on one or more non-transitory recording media such as a ROM, an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

Embodiments of the present disclosure are described below. Note that each of the embodiments described below illustrates a specific example of the present disclosure. Numerical values, shapes, materials, constituent elements, ways in which the constituent elements are arranged and connected, and the like in the embodiments below are examples and do not limit the present disclosure. Various aspects described herein can be combined as long as no contradiction occurs. Among constituent elements in the embodiments described below, constituent elements that are not described in independent claims that indicate the highest concepts are described as optional constituent elements.

Each of the drawings is a schematic view and is not necessarily exact illustration. Therefore, scales and the like in the drawings do not necessarily match. In the drawings, elements that are substantially identical are given identical reference signs, and overlapping description is omitted or simplified.

In the specification and drawings, the X axis, Y axis, and Z axis represent three axes of a three-dimensional orthogonal coordinate system. In the present embodiment, the Z axis direction is a vertical direction, and a direction perpendicular to the Z axis (direction parallel with the XY plane) is a horizontal direction. The X axis and the Y axis are orthogonal to each other and are orthogonal to the Z axis. The "plan view" as used herein refers to view taken when a surface of a first electrode 10, a second electrode 20, a third electrode 30, or a substrate 40 is viewed from the vertical direction. Specifically, the "plan view" is the XZ plane.

Embodiment 1

Figure 2B:
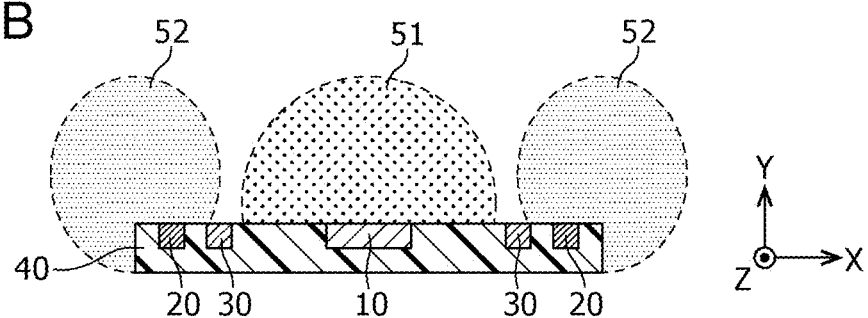
FIG. 2B is a diagram schematically illustrating a distribution of the first detection region and the second detection region in cross sectional view taken along line IIB-IIB of FIG. 2A in the non-contact sensor according to Embodiment 1.
Figure 2C:
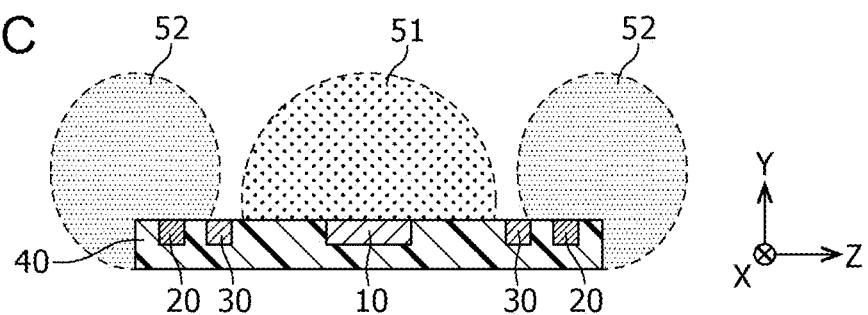
FIG. 2C is a diagram schematically illustrating a distribution of the first detection region and the second detection region in cross sectional view taken along line IIC-IIC of FIG. 2A in the non-contact sensor according to Embodiment 1.

A configuration of a non-contact sensor 1 according to Embodiment 1 is described below with reference to FIGS. 1A through 2C. FIG. 1A is a plan view of the non-contact sensor 1 according to Embodiment 1, and FIG. 1B is a cross-sectional view of the non-contact sensor 1 taken along line IB-IB of FIG. 1A. For easier understanding of a pattern and a positional relationship among the first electrode 10, the second electrode 20, and the third electrode 30, regions where the first electrode 10, the second electrode 20, and the third electrode 30 are disposed are hatched in FIG. 1A. FIGS. 2A through 2C are diagrams schematically illustrating a distribution (ranges) of a first detection region 51 and a second detection region 52 in the non-contact sensor 1. FIG. 2A illustrates the distribution in plan view, FIG. 2B illustrates the distribution in cross sectional view taken along line IIB-IIB of FIG. 2A, and FIG. 2C illustrates the distribution in cross sectional view taken along line IIC-IIC of FIG. 2A.

The non-contact sensor 1 is a non-contact type sensor that is capable of detecting a target such as a human or an object in a non-contact manner. The non-contact sensor 1 is a capacitance type sensor that detects approach of a target by detecting a change of electrostatic capacitance that occurs between the target and the non-contact sensor 1. Note that the non-contact sensor 1 is capable of detecting a target not only in a case where the target approaches, but also in a case where the target makes contact with the non-contact sensor 1.

As illustrated in FIGS. 1A and 1B, the non-contact sensor 1 includes the first electrode 10, the second electrode 20, and the third electrode 30. In the present embodiment, the non-contact sensor 1 further includes the substrate 40. The substrate 40 can be a resin substrate made of a resin material, a metal-based substrate obtained by insulation-coating a metal, or the like. Note that the shape of the substrate 40 in plan view is, for example, rectangular, but is not limited to this.

The first electrode 10, the second electrode 20, and the third electrode 30 are, for example, made of a metal material such as copper or silver and are provided on one surface of the substrate 40 in predetermined patterns at predetermined locations. Specifically, the first electrode 10, the third electrode 30, and the second electrode 20 are disposed in this order from the center toward the outer side of the substrate 40. As illustrated in FIG. 1B, each of the first electrode 10, the second electrode 20, and the third electrode 30 is electrically connected to a determination circuit 200 in order to detect a change of electrostatic capacitance caused by approach of a target. Note that the determination circuit is omitted in the drawings other than FIG. 1B.

As illustrated in FIG. 1A, the first electrode 10 is disposed on an inner side of the second electrode 20. The first electrode 10, for example, has a circular shape in plan view and is disposed at the center of the substrate 40. The diameter of the first electrode 10 is, for example, 20 to 40 mm. Note that the shape of the first electrode 10 in plan view is not limited to a circular shape and can be a rectangular shape or the like.

As illustrated in FIGS. 2A and 2B, the first electrode 10 functions as a first sensor unit that detects approach of a target to the first electrode 10 when the target enters a first region. This first region is herein referred to as the first detection region 51. That is, the first detection region 51 is a region where a target can be detected by the first electrode 10.

Meanwhile, the second electrode 20 functions as a second sensor unit that detects approach of a target to the second electrode 20 when the target enters a second region. This second region is herein referred to as the second detection region 52. That is, the second detection region 52 is a region where a target can be detected by the second electrode 20.

As illustrated in FIGS. 1A and 1B, the second electrode 20 is disposed in at least part of a region on the outer side of the first electrode 10. In the present embodiment, the second electrode 20 is disposed on the outer side of the third electrode 30 that is disposed on the outer side of the first electrode 10, and the second electrode 20 is disposed so as to surround the first electrode 10 with the third electrode 30 interposed therebetween. Specifically, the second electrode 20 is concentric with the first electrode 10 and is continuously disposed in a constant width so as to form a frame surrounding the whole first electrode 10 and third electrode 30. The width of the second electrode 20 is, for example, 2 mm.

The second electrode 20 is spaced away from the first electrode 10 and the third electrode 30 by predetermined intervals. The interval between the first electrode 10 and the third electrode 30 is, for example, 30 to 40 mm. The interval between the third electrode 30 and the second electrode 20 is, for example, 2 mm. In the present embodiment, the second electrode 20 is disposed along an outer edge of the substrate 40. Note that the second electrode 20 is disposed so as to form a frame having a substantially rectangular shape in plan view but is not limited to this. For example, the second electrode 20 may be disposed so as to form a frame having a circular shape in plan view so as to be concentric with the first electrode 10.

As illustrated in FIGS. 1A and 1B, the third electrode 30 is disposed between the first electrode 10 and the second electrode 20. In the present embodiment, the third electrode 30 is a ground electrode (GND electrode) that is set to a ground electric potential. The electric potential of the first electrode 10 is set to be, for example, +3 V. The electric potential of the second electrode 20 is set to be, for example, +3 V.

In the present embodiment, the third electrode 30 is disposed so as to surround the first electrode 10. Specifically, the third electrode 30 is concentric with the first electrode 10 and is disposed so as to surround the entire periphery of the first electrode 10. The third electrode 30 is continuously disposed while keeping a constant width. The width of the third electrode 30 is, for example, 2 mm.

Note that the first electrode 10, the second electrode 20, and the third electrode 30 are disposed in a concentric manner, but the present embodiment is not limited to this. The third electrode 30 is disposed so as to a frame having a substantially rectangular shape in plan view but is not limited to this. For example, the third electrode 30 may be disposed so as to form a frame having a circular shape in plan view. In the present embodiment, the second electrode 20 and the third electrode 30 are similar. However, the present embodiment is not limited to this.

In the non-contact sensor 1 configured as above, the third electrode 30 set to a ground electric potential is disposed between the first electrode 10 and the second electrode 20.

In the present embodiment, in plan view, the second detection region 52 where a target can be detected by the second electrode 20 surrounds the first detection region 51 where a target can be detected by the first electrode 10, as illustrated in FIG. 2A. Specifically, since the second electrode 20 continuously surrounds the entire periphery of the first electrode 10, the second detection region 52 continuously surrounds the entire periphery of the first detection region 51.

In any cross section, at least part of the first detection region 51 including the center thereof does not overlap the second detection region 52. Specifically, in cross sectional view taken on XY cross section that is a first cross section, a cross section of the first detection region 51 is sandwiched between two cross sections of the second detection region 52, as illustrated in FIG. 2B. Furthermore, in cross sectional view taken on YZ cross section that is a second cross section orthogonal to the first cross section, a cross section of the first detection region 51 is also sandwiched between two cross sections of the second detection region 52.

Figure 3A:
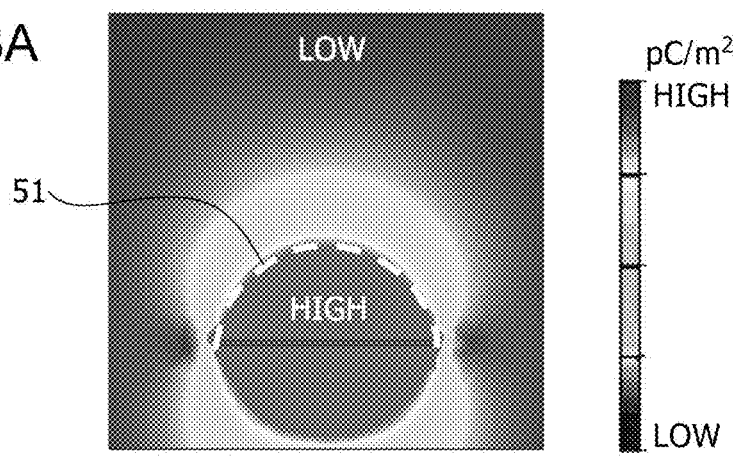
FIG. 3A is a diagram illustrating a distribution of the first detection region in the non-contact sensor according to Embodiment 1.
Figure 3B:
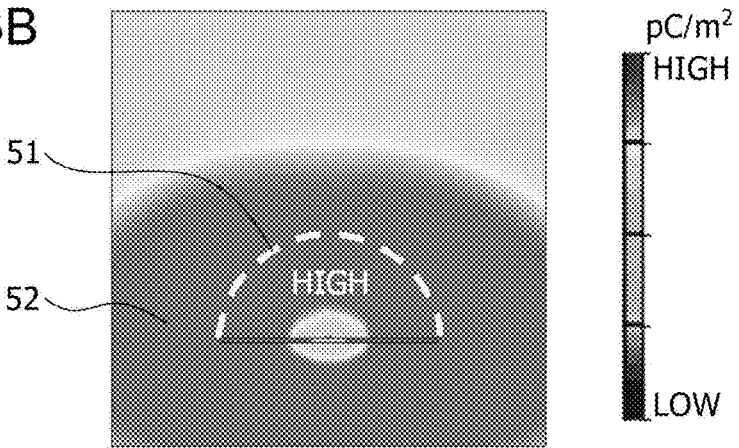
FIG. 3B is a diagram illustrating a distribution of the second detection region in a non-contact sensor in which no third electrode is disposed.
Figure 3C:
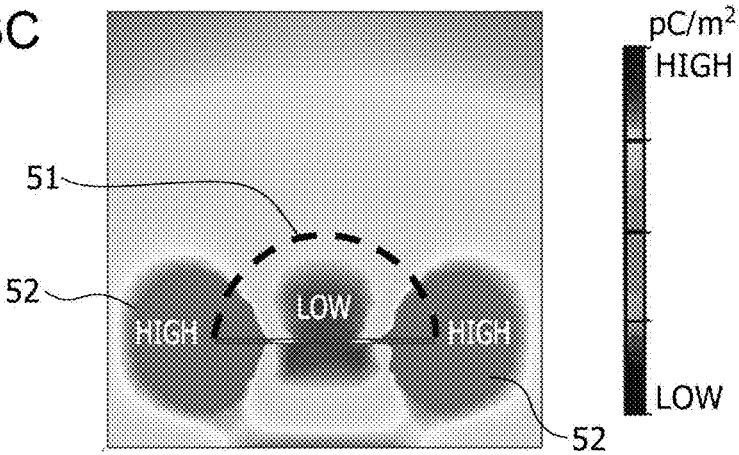
FIG. 3C is a diagram illustrating a distribution of the second detection region in the non-contact sensor according to Embodiment 1.

A distribution of the first detection region 51 and the second detection region 52 is described below with reference to FIGS. 3A through 3C. FIGS. 3A through 3C are diagrams illustrating simulation results of electric flux densities of the first electrode 10 and the second electrode 20. FIG. 3A illustrates a distribution of the first detection region where a target can be detected by the first electrode 10, FIG. 3B illustrates a distribution of the second detection region where a target can be detected by the second electrode 20 in a case where the third electrode 30 is not provided, and FIG. 3C illustrates a distribution of the second detection region in a case where the third electrode 30 set to a ground electric potential is provided.

As is clear from a comparison between FIGS. 3A and 3B, the second detection region 52 overlaps all of the first detection region 51unless the third electrode 30 set to a ground electric potential is provided. As a result, it is difficult to detect approach of a target only by the first electrode 10.

Meanwhile, a space where a target cannot be detected by the second electrode 20 is created on the inner side of the second electrode 20 by disposing the third electrode 30 set to a ground electric potential on the inner side of the second electrode 20, as illustrated in FIG. 3C. As a result, in a region (central region) on the inner side of the second electrode 20, approach of a target can be detected only by the first electrode 10 by disposing the first electrode 10 on the inner side of the second electrode 20 with the third electrode 30 set to a ground electric potential interposed therebetween.

Figure 4:
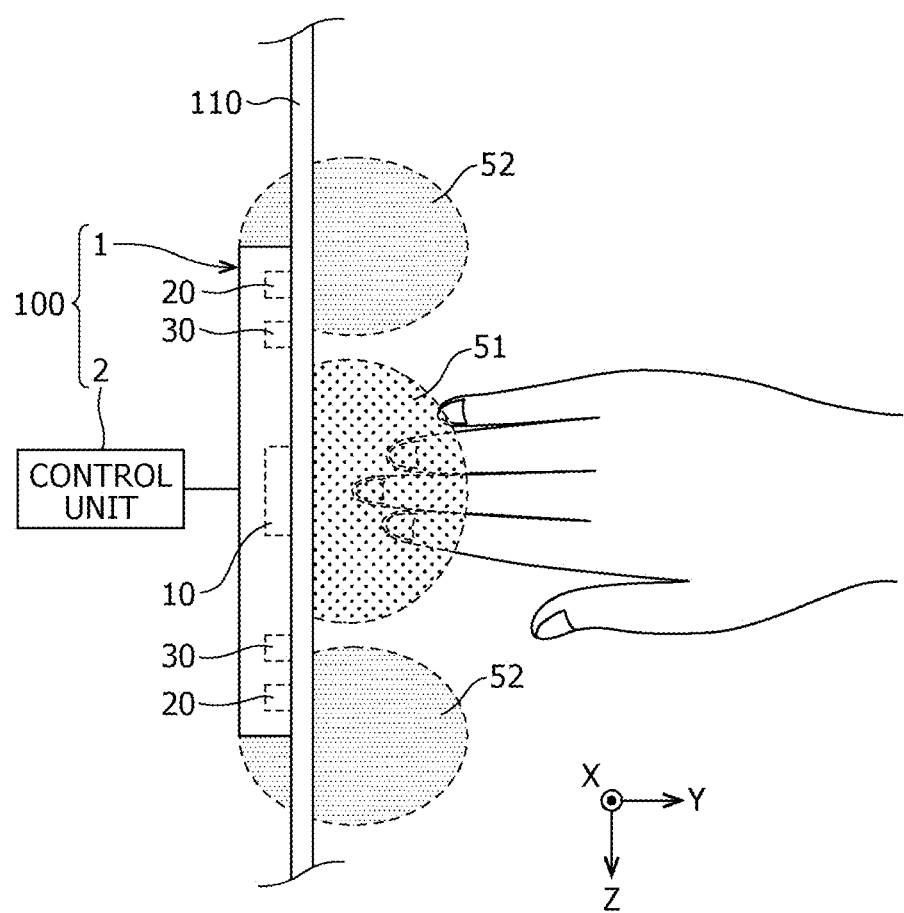
FIG. 4 is a diagram illustrating an example of a non-contact operating switch using the non-contact sensor according to Embodiment 1.

Next, an example of a detection method of the non-contact sensor 1 according to the present embodiment is described below with reference to FIG. 4. FIG. 4 is a diagram illustrating an example of a non-contact operating switch 100 using the non-contact sensor 1 according to Embodiment 1.

The non-contact operating switch 100 includes the non-contact sensor 1 and a control unit 2 that generates an operation signal for operating an apparatus on the basis of a detection signal generated by the non-contact sensor 1.

The non-contact operating switch 100 is, for example, provided on a rear surface of a mirror 110 of a washing stand. It is thus possible to detect a target when the target approaches the non-contact sensor 1. Note that an apparatus to be operated by the non-contact operating switch 100 is, for example, a lighting device (not illustrated) provided on the washing stand.

In this case, when a user brings his or her hand close to the first electrode 10 in order to operate the lighting device as illustrated in FIG. 4, the non-contact sensor 1 generates a detection signal indicating that the user's hand has been detected. The control unit 2 receives the detection signal generated by the non-contact sensor 1, generates an operation signal for operating ON/OFF of the lighting device on the basis of this detection signal, and then supplies the operation signal to the lighting device. This allows the user to perform an operation such as an operation of turning the lighting device on or off.

Figure 5:
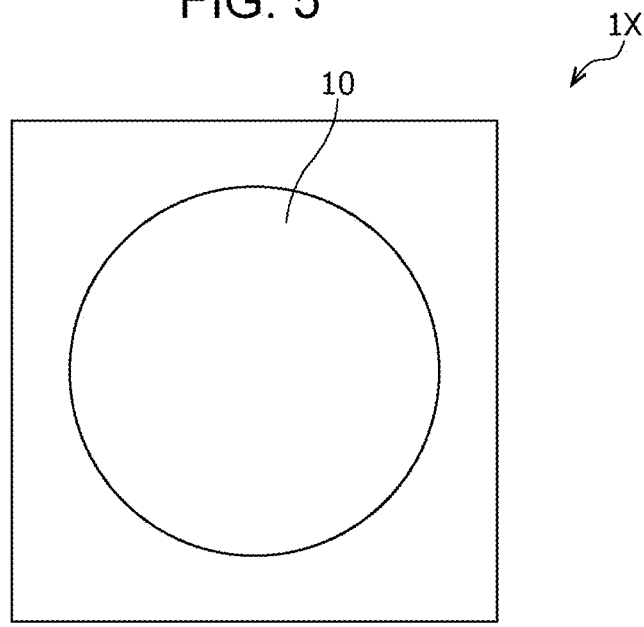
FIG. 5 is a plan view of a non-contact sensor according to a comparative example.
Figure 6:
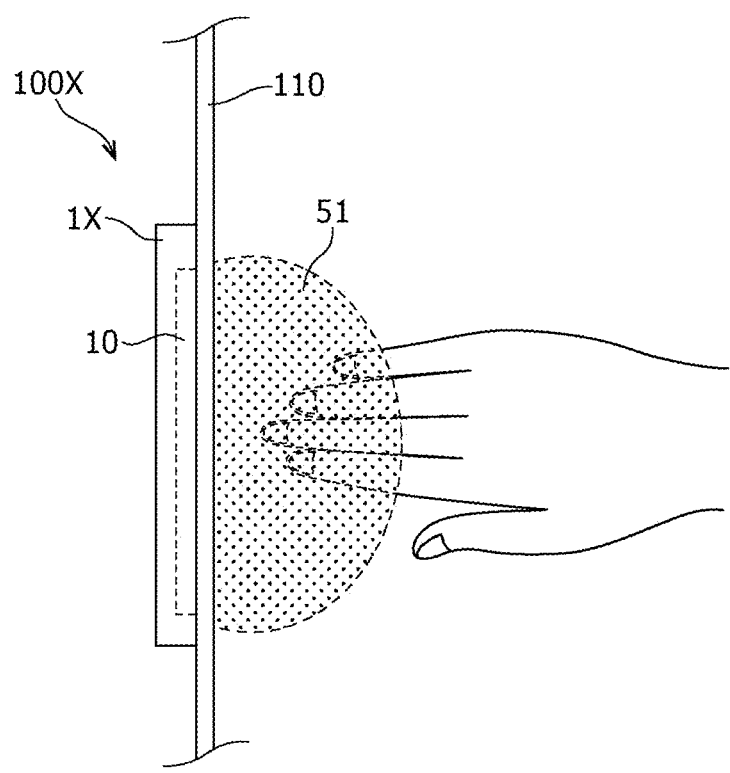
FIG. 6 is a diagram illustrating an example of use of a non-contact operating switch using the non-contact sensor according to the comparative example.
Figure 7:
FIG. 7 is a diagram illustrating an example of use of the non-contact operating switch using the non-contact sensor according to the comparative example.
Figure 8:
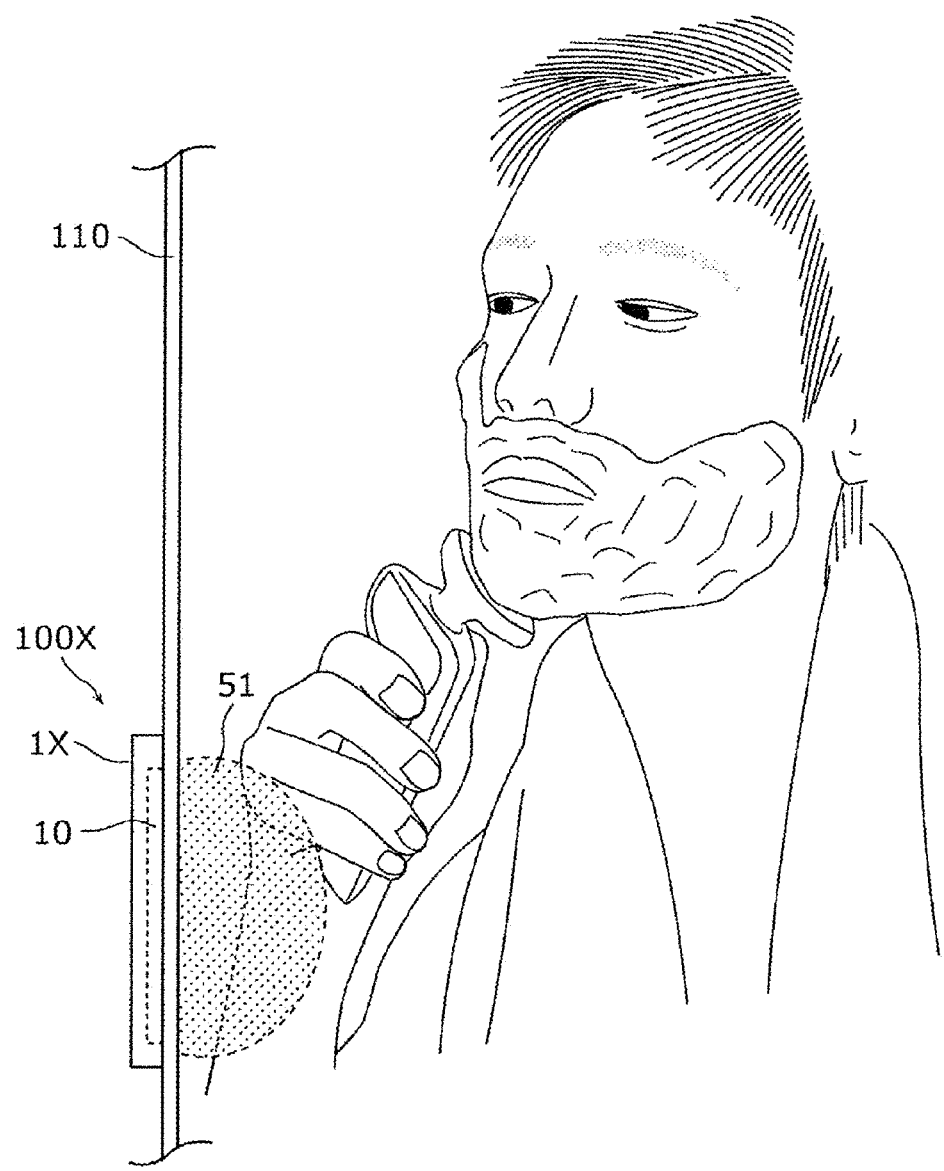
FIG. 8 is a diagram illustrating an example of use of the non-contact operating switch using the non-contact sensor according to the comparative example.
Figure 9:
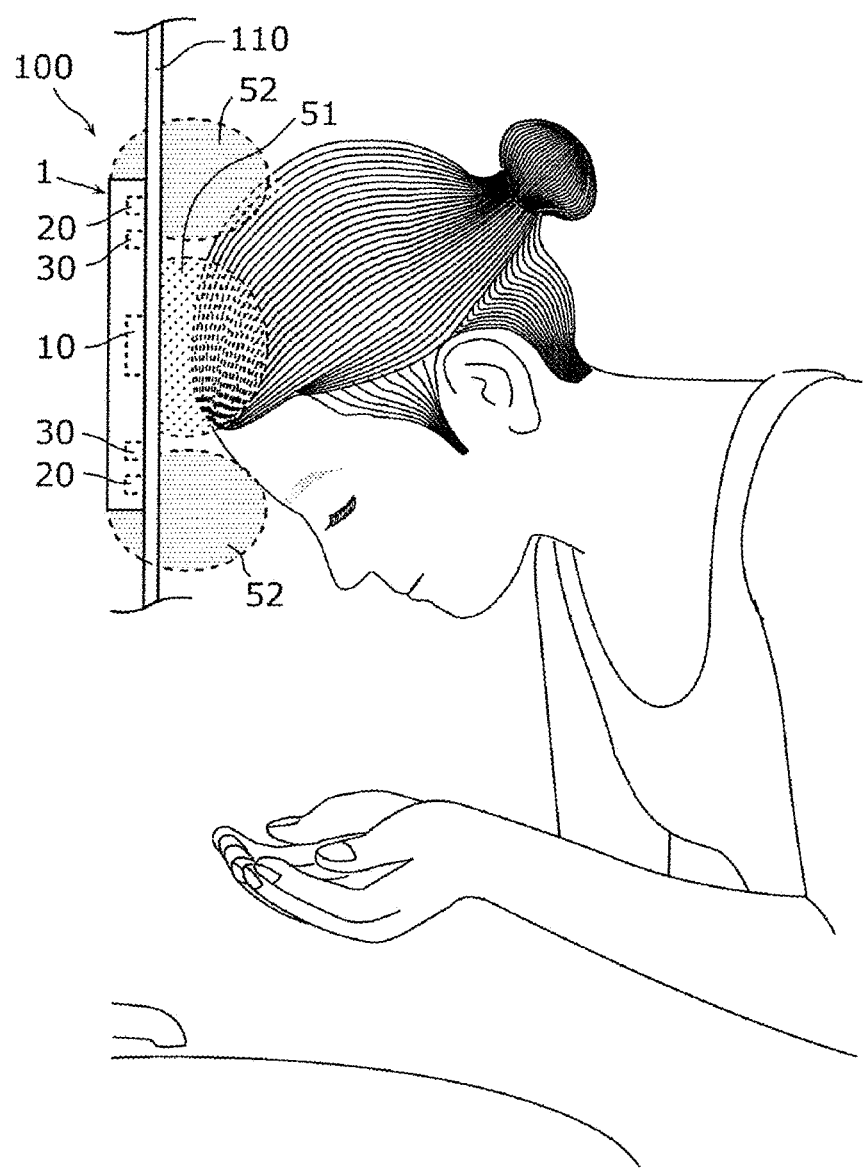
FIG. 9 is a diagram illustrating an example of use of the non-contact operating switch using the non-contact sensor according to Embodiment 1.
Figure 10:
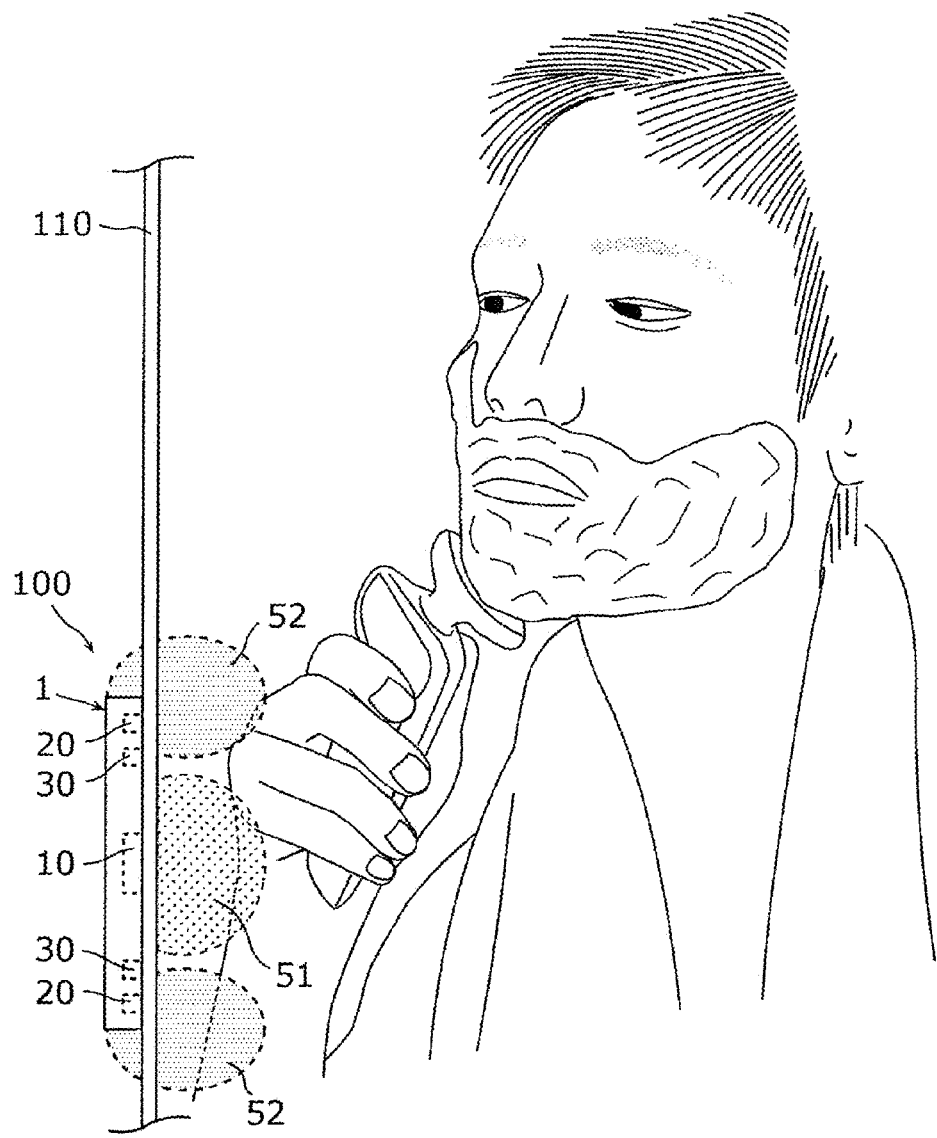
FIG. 10 is a diagram illustrating an example of use of the non-contact operating switch using the non-contact sensor according to Embodiment 1.

A detection method of the non-contact sensor 1 according to the present embodiment is described in comparison with a non-contact sensor 1X according to a comparative example with reference to FIGS. 4 and 5 through 10. FIG. 5 is a plan view of the non-contact sensor 1X according to the comparative example, and FIGS. 6 through 8 are diagrams illustrating an example of use of a non-contact operating switch 100X using the non-contact sensor 1X according to the comparative example. FIGS. 9 and 10 are diagrams illustrating an example of use of the non-contact operating switch 100 using the non-contact sensor 1 according to Embodiment 1.

The non-contact sensor 1X according to the comparative example illustrated in FIG. 5 is a capacitance-type sensor and has only a first electrode 10. The non-contact operating switch 100X using the non-contact sensor 1X according to the comparative example allows a user to operate an apparatus to be operated such as a lighting device by bringing his or her hand close to the first electrode 10 of the non-contact sensor 1X in order to operate the apparatus to be operated, as illustrated in FIG. 6.

However, the non-contact sensor 1X according to the comparative example sometimes reacts even if a user does not intend to operate the apparatus. That is, the non-contact sensor 1X sometimes reacts to an operation that is not intended by a user.

For example, when a user's head comes close to the non-contact sensor 1X unintentionally during face washing as illustrated in FIG. 7, the user's head exists in the first detection region 51. As a result, the non-contact sensor 1X reacts, and the apparatus to be operated is operated although the user does not intend to operate the apparatus. Specifically, the lighting device is turned on or off although the user does not intend to turn the lighting device on or off.

Furthermore, when a user's arm comes close to the non-contact sensor 1X unintentionally during shaving as illustrated in FIG. 8, the user's arm exists in the first detection region 51. As a result, the non-contact sensor 1X reacts, and the apparatus to be operated is operated although the user does not intend to operate the apparatus. Furthermore, the non-contact sensor 1X also sometimes reacts when a user's arm comes close to the non-contact sensor 1X unintentionally during brushing of teeth.

Figure 19:
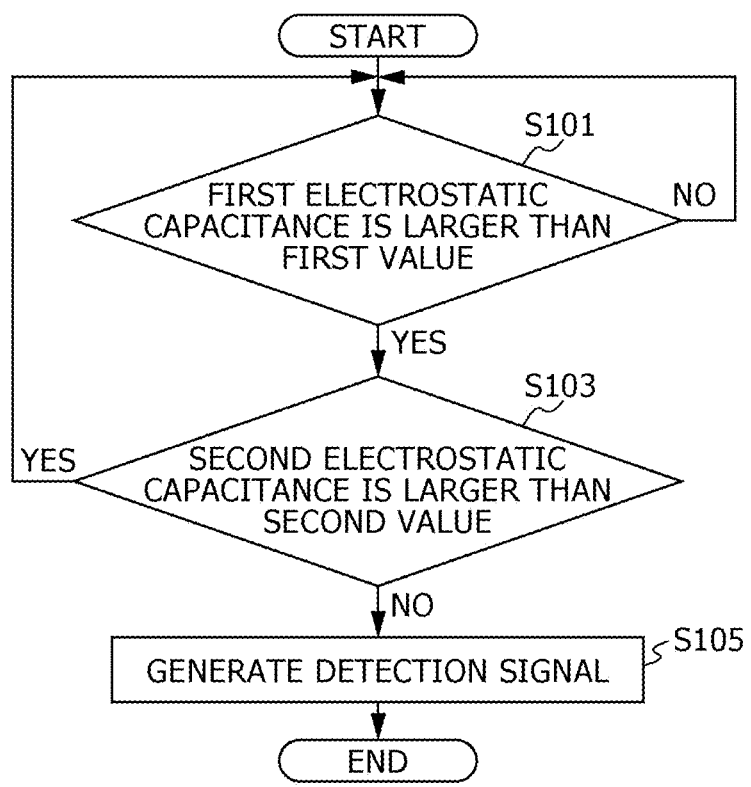
FIG. 19 is a flowchart illustrating an example of processing of a determination circuit of the non-contact sensor according to Embodiment 1.
Figure 20:
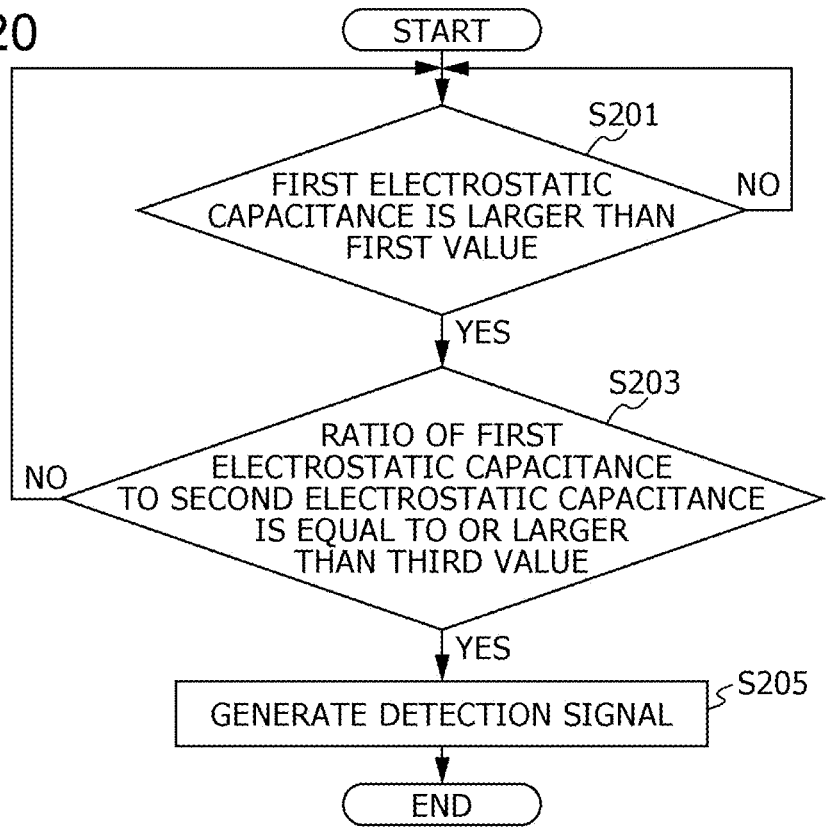
FIG. 20 is a flowchart illustrating an example of processing of the determination circuit of the non-contact sensor according to Embodiment 1.

Meanwhile, the non-contact sensor 1 according to the present embodiment is configured to detect only an operation that is intended by a user and not to react to an operation that is not intended by a user according to the following detection determining algorithm. FIGS. 19 through 21 are flowcharts illustrating an example of processing of the determination circuit 200 of the non-contact sensor 1 according to the present embodiment.

Specifically, as illustrated in FIG. 19, the determination circuit 200 of the non-contact sensor 1 compares first electrostatic capacitance detected by the first electrode 10 and a first value (S101). In a case where the first electrostatic capacitance is larger than the first value (YES in S101), the determination circuit 200 compares second electrostatic capacitance detected by the second electrode 20 and a second value (S103). In a case where the second electrostatic capacitance is not larger than the second value (NO in S103), a detection signal is generated as an output signal (S105). In a case where the second electrostatic capacitance is larger than the second value (YES in S103), the determination circuit 200 generates no detection signal even in a case where the first electrostatic capacitance is larger than the first value (YES in S101).

That is, the determination circuit 200 generates a detection signal in a case where a target enters only the first detection region 51, whereas the determination circuit 200 generates no detection signal in a case where a target enters both of the first detection region 51 and the second detection region 52. In other words, in a case where approach of a target is being detected by the second detection region 52, the determination circuit 200 makes the approach of the target ineffective even in a case where approach of the target is detected by the first detection region 51.

Specifically, in a case where a user's hand enters only the first detection region 51 as illustrated in FIG. 4, the non-contact sensor 1 reacts, and a detection signal is generated. Meanwhile, in a case where a user's head approaches the non-contact sensor 1 unintentionally during face washing as illustrated in FIG. 9, the user's head enters the first detection region 51 and the second detection region 52, and therefore the non-contact sensor 1 does not react, and no detection signal is generated. Similarly, in a case where a user's arm approaches the non-contact sensor 1 unintentionally during shaving as illustrated in FIG. 10, the user's arm enters the first detection region 51 and the second detection region 52, and therefore the non-contact sensor 1 does not react, and no detection signal is generated.

This allows the non-contact sensor 1 to react in a case where a target enters only the first detection region 51. As a result, the non-contact sensor 1 reacts only when a user intentionally operates an apparatus, and it is therefore possible to prevent the non-contact sensor 1 from reacting to an operation that is not intended by a user. For example, it is possible to prevent erroneous reaction of the non-contact sensor 1 caused by an operation resulting from a user's head or arm that is not intended by the user, and thus the non-contact sensor 1 can be configured to react only to an intended operation using a hand.

Instead of the aforementioned detection determination algorithm, the determination circuit 200 of the non-contact sensor 1 may generate a detection signal according to the following detection determination algorithm. Specifically, as illustrated in FIG. 20, the determination circuit 200 of the non-contact sensor 1 compares the first electrostatic capacitance and the first value (S201). In a case where the first electrostatic capacitance is larger than the first value (YES in S201), the determination circuit 200 compares a ratio of the first electrostatic capacitance to the second electrostatic capacitance and a third value (S203). In a case where the ratio of the first electrostatic capacitance to the second electrostatic capacitance is equal to or larger than the third value (YES in S203), the determination circuit 200 generates a detection signal (S205). For example, the determination circuit 200 generates a detection signal in a case where the ratio of the first electrostatic capacitance to the second electrostatic capacitance is larger than 1. In a case where the ratio of the first electrostatic capacitance to the second electrostatic capacitance is smaller than the third value (NO in S203), the determination circuit 200 generates no detection signal even in a case where the first electrostatic capacitance is larger than the first value (YES in S201).

This allows the determination circuit 200 to detect entry of a target into the first detection region 51 even in a case where the target exists in both of the first detection region 51 and the second detection region 52. For example, the determination circuit 200 detects entry of a user's hand into the first detection region 51 even in a case where the user's hand unintentionally reaches the second detection region 52 when the user brings the hand into the first detection region 51 of the non-contact sensor 1 in order to operate an apparatus. That is, the determination circuit 200 can determine that the user has tries to operate the apparatus. As a result, the non-contact sensor 1 makes it possible to correctly perform an operation intended by a user while preventing the non-contact sensor 1 from reacting to an operation that is not intended by the user.

Instead of the aforementioned detection determining algorithm, the determination circuit 200 of the non-contact sensor 1 may generate a detection signal according to the following detection determining algorithm. Specifically, as illustrated in FIG. 21, the determination circuit 200 of the non-contact sensor 1 compares the first electrostatic capacitance and the first value (S301). In a case where the first electrostatic capacitance is larger than the first value (YES in S301), the determination circuit 200 compares the second electrostatic capacitance and the second value (S303). In a case where the second electrostatic capacitance is not larger than the second value (NO in S303), the determination circuit 200 compares the ratio of the first electrostatic capacitance to the second electrostatic capacitance and the third value (S305). In a case where the ratio of the first electrostatic capacitance to the second electrostatic capacitance is equal to or larger than the third value (YES in S305), the determination circuit 200 generates a detection signal (S307). For example, the determination circuit 200 generates a detection signal in a case where a ratio of electrostatic capacitance detected by the first detection region 51 to electrostatic capacitance detected by the second detection region 52 is larger than 1.

This allows the determination circuit 200 to more accurately detect entry of a target into the first detection region 51 even in a case where the target exist in both of the first detection region 51 and the second detection region 52. As a result, it is possible to more accurately determine that a user has brought his or her hand into the first detection region 51, and therefore the non-contact sensor 1 makes it possible to more correctly perform an operation intended by a user while preventing the non-contact sensor 1 from reacting to an operation that is not intended by the user.

As described above, the non-contact sensor 1 according to the present embodiment includes the first electrode 10, the second electrode 20 that is disposed in at least part of a region on the outer side of the first electrode 10, and the third electrode 30 that is disposed between the first electrode 10 and the second electrode 20 and is set to an electric potential lower than those of the first electrode 10 and the second electrode 20. The third electrode 30 may be set to a ground electric potential.

This makes it possible to form the first detection region 51 and the second detection region 52 in each of which a target can be detected. Therefore, while the second detection region 52 is detecting approach of a target, approach of the target can be made ineffective even in a case where approach of the target is detected by the first detection region 51. It is therefore possible to prevent the non-contact sensor 1 from reacting to an operation that is not intended by a user.

Embodiment 2

Figure 11:
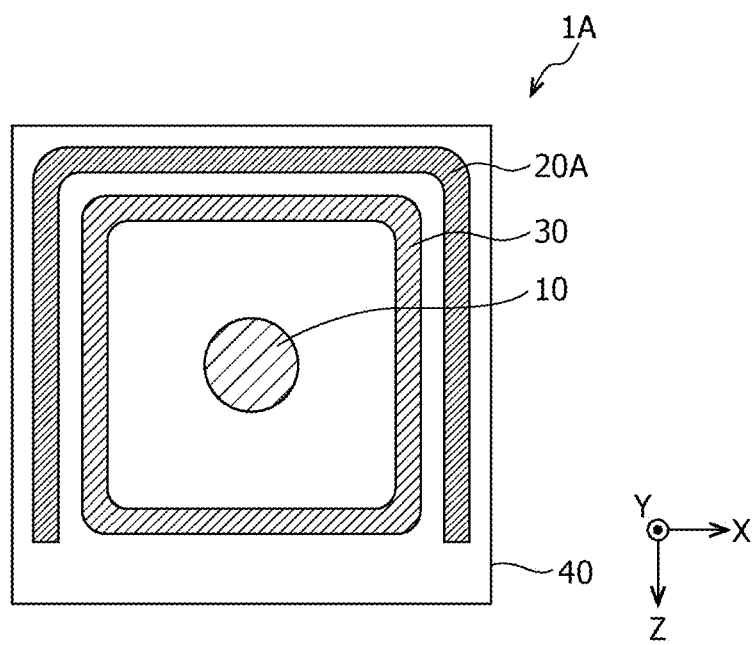
FIG. 11 is a plan view of a non-contact sensor according to Embodiment 2.
Figure 12A:
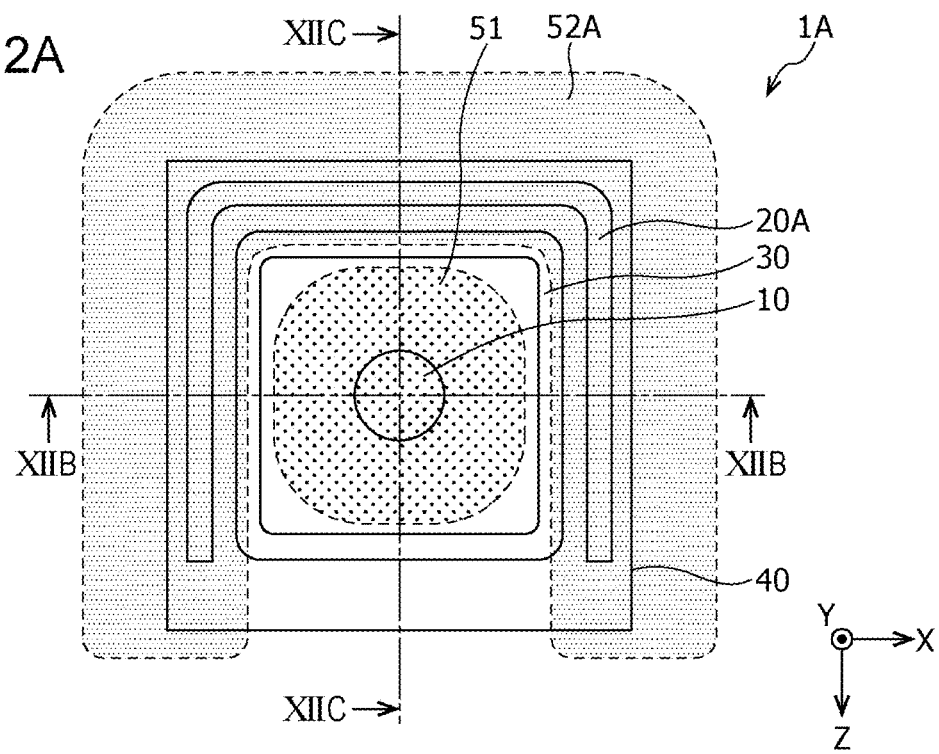
FIG. 12A is a diagram schematically illustrating a distribution of a first detection region and a second detection region in plan view in the non-contact sensor according to Embodiment 2.
Figure 12B:
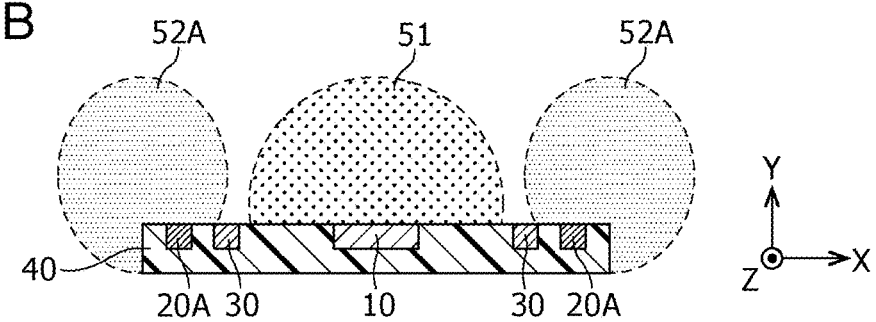
FIG. 12B is a diagram schematically illustrating a distribution of the first detection region and the second detection region in cross sectional view taken along line XIIB-XIIB of FIG. 12A in the non-contact sensor according to Embodiment 2.
Figure 12C:
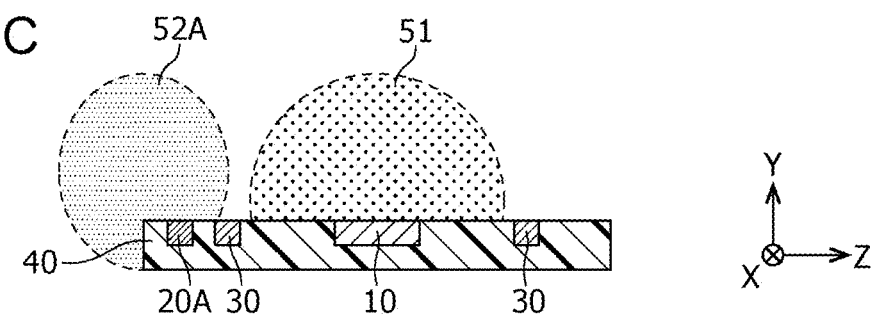
FIG. 12C is a diagram schematically illustrating a distribution of the first detection region and the second detection region in cross sectional view taken along line XIIC-XIIC of FIG. 12A in the non-contact sensor according to Embodiment 2.

Next, a configuration of a non-contact sensor 1A according to Embodiment 2 is described with reference to FIGS. 11 through 12C. FIG. 11 is a plan view of the non-contact sensor 1A according to Embodiment 2. FIGS. 12A through 12C are diagrams schematically illustrating a distribution of a first detection region 51 and a second detection region 52A in the non-contact sensor 1A. FIG. 12A illustrates the distribution in plan view, FIG. 12B illustrates the distribution in cross sectional view taken along line XIIB-XIIB of FIG. 12A, and FIG. 12C illustrates the distribution in cross sectional view taken along line XIIC-XIIC of FIG. 12A. For easier understanding of a pattern and a positional relationship among a first electrode 10, a second electrode 20A, and a third electrode 30, regions in which the first electrode 10, the second electrode 20A, and the third electrode 30 are disposed are hatched in FIG. 11.

A difference between the non-contact sensor 1A according to the present embodiment and the non-contact sensor 1 according to Embodiment 1 lies in the shape of the second electrode 20A. Specifically, the second electrode 20 according to Embodiment 1 is continuously disposed so as to surround the entire peripheries of the first electrode 10 and the third electrode 30, whereas the second electrode 20A according to the present embodiment has a gap and is disposed so as to surround part of the peripheries of the first electrode 10 and the third electrode 30.

Specifically, the second electrode 20A surrounds a half or more of the peripheries of the first electrode 10 and the third electrode 30 in plan view, as illustrated in FIG. 11. More specifically, the second electrode 20A is disposed so as to form a U shape and surround three sides among four sides of the third electrode 30 having a rectangular frame shape.

As described above, in the present embodiment, the second electrode 20A surrounds a half or more of the periphery of the first electrode 10. Accordingly, in plan view, the second detection region 52A where a target can be detected by the second electrode 20A surrounds a half or more of the periphery of the first detection region 51 where a target can be detected by the first electrode 10, as illustrated in FIG. 12A.

In cross sectional view taken on XY cross section that is a first cross section, a cross section of the first detection region 51 is sandwiched between two cross sections of the second detection region 52A, as illustrated in FIG. 12B. In cross sectional view taken on YZ cross section that is a second cross section orthogonal to the first cross section, a cross section of the second detection region 52A is located on the one side of a cross section of the first detection region 51, as illustrated in FIG. 12C.

The non-contact sensor 1A according to the present embodiment configured as above is applicable to a non-contact operating switch, as in Embodiment 1. Furthermore, the non-contact sensor 1A according to the present embodiment can detect a target such as a user's hand according to a detection determining algorithm similar to that in Embodiment 1. This makes it possible to produce effects similar to those in Embodiment 1. For example, it is possible to prevent the non-contact sensor 1A from reacting to an operation that is not intended by a user.

Furthermore, the non-contact sensor 1A according to the present embodiment produces the following effects.

Figure 13:
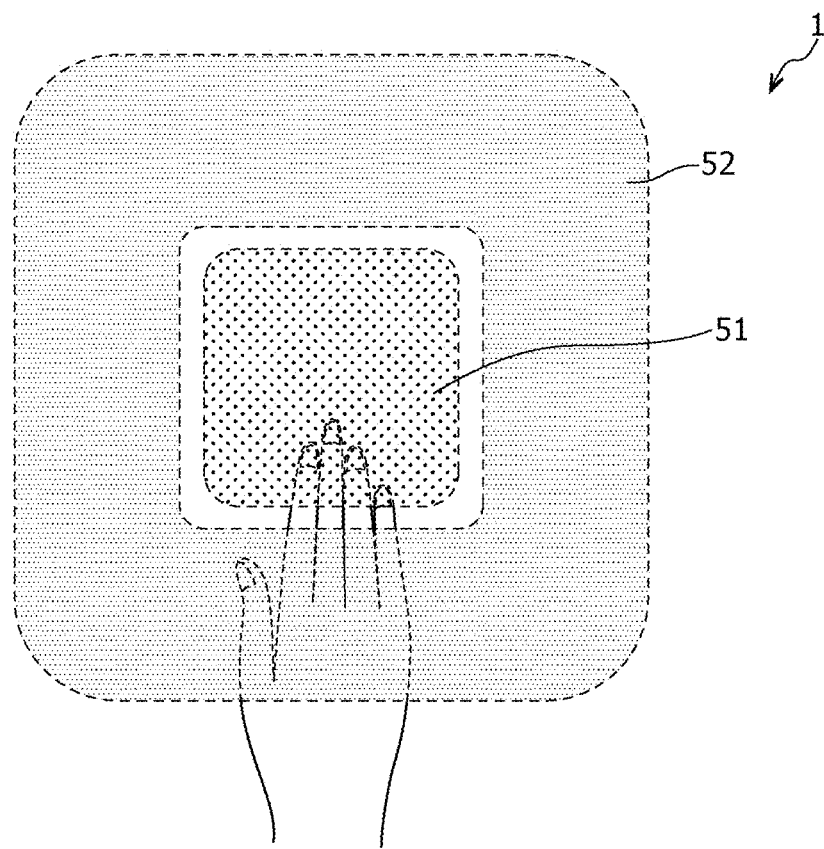
FIG. 13 is a diagram illustrating an example of use of the non-contact sensor according to Embodiment 1.

As illustrated in FIG. 13, according to the non-contact sensor 1 according to Embodiment 1, when a user puts his or her hand into the first detection region 51, the hand sometimes also enters the second detection region 52 in which it is determined that a user's operation is ineffective, and as a result the non-contact sensor 1 does not react even to an operation that is intended by the user depending on a detection determining algorithm.

Figure 14:
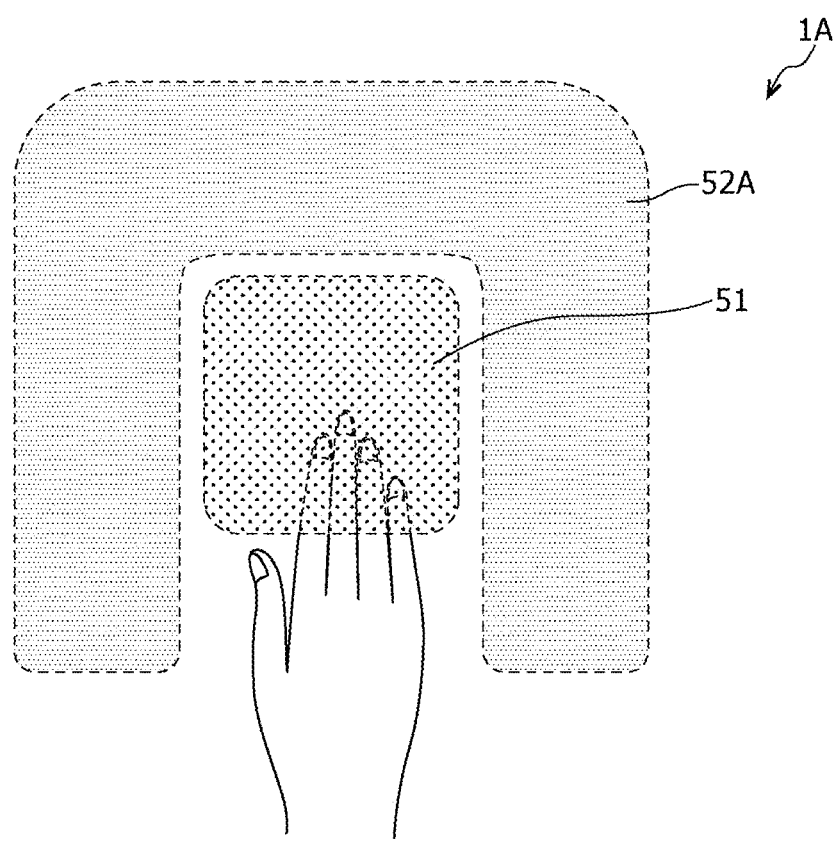
FIG. 14 is a diagram illustrating an example of use of the non-contact sensor according to Embodiment 2.

Meanwhile, according to the non-contact sensor 1A according to the present embodiment, a user can put his or her hand into the first detection region 51 only without putting the hand into the second detection region 52A since the second detection region 52A has a gap, as illustrated in FIG. 14. This allows a user to operate the non-contact sensor 1A, for example, by using not only a tip of a hand, but also a palm. As a result, it is possible to accurately determine that a user has brought his or her hand into the first detection region 51, and therefore the non-contact sensor 1A can be configured to correctly react to an operation that is intended by the user while preventing the non-contact sensor 1A from reacting to an operation that is not intended by the user.

As described above, the non-contact sensor 1A according to the present embodiment includes the first electrode 10, the second electrode 20A that is disposed in at least part of a region on the outer side of the first electrode 10, and the third electrode 30 that is disposed between the first electrode 10 and the second electrode 20A and is set to an electric potential lower than those of the first electrode 10 and the second electrode 20A, as in Embodiment 1. The third electrode 30 may be set to a ground electric potential.

This makes it possible to form the first detection region 51 and the second detection region 52A in each of which a target can be detected, thereby preventing the non-contact sensor 1A from reacting to an operation that is not intended by a user, as in Embodiment 1.

Furthermore, in the present embodiment, the second detection region 52A surrounds a half or more of the periphery of the first detection region 51 in plan view. In cross sectional view taken on XY cross section that is a first cross section, a cross section of the first detection region 51 is sandwiched between two cross sections of the second detection region 52A. In cross sectional view taken on YZ cross section that is a second cross section orthogonal to the first cross section, a cross section of the second detection region 52A is located on one side of a cross section of the first detection region 51, as illustrated in FIG. 12C.

This makes it possible to accurately determine that a user has brought his or her hand or the like into the first detection region 51, thereby allowing the non-contact sensor 1A to correctly react to an operation that is intended by the user while preventing the non-contact sensor 1A from reacting to an operation that is not intended by the user, as described above.

Embodiment 3

Figure 15:
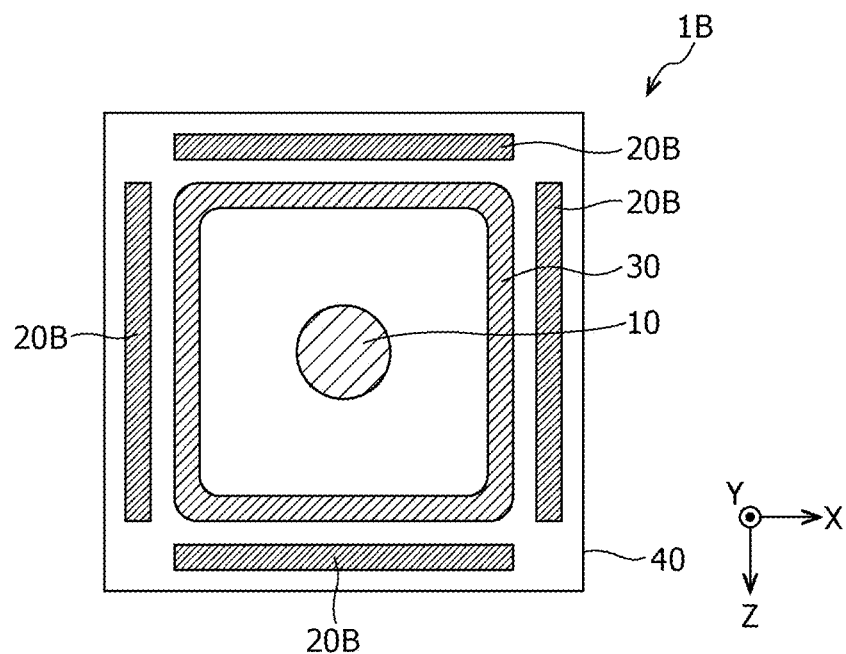
FIG. 15 is a plan view of a non-contact sensor according to Embodiment 3.
Figure 16A:
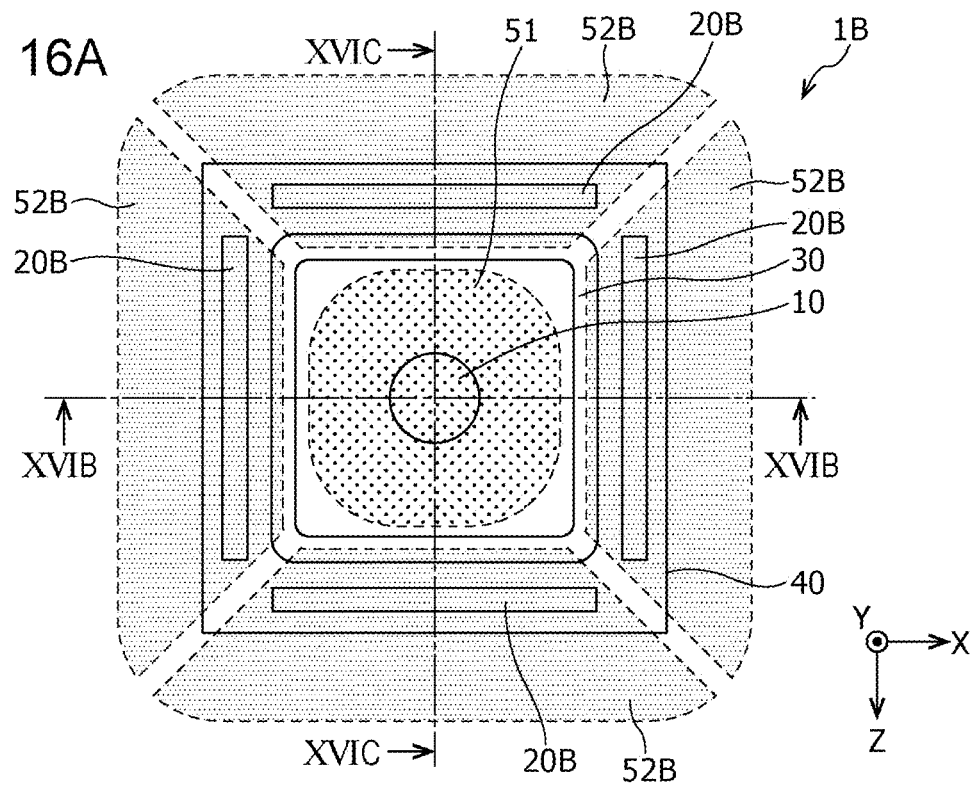
FIG. 16A is a diagram schematically illustrating a distribution of a first detection region and second detection regions in plan view in the non-contact sensor according to Embodiment 3.
Figure 16B:
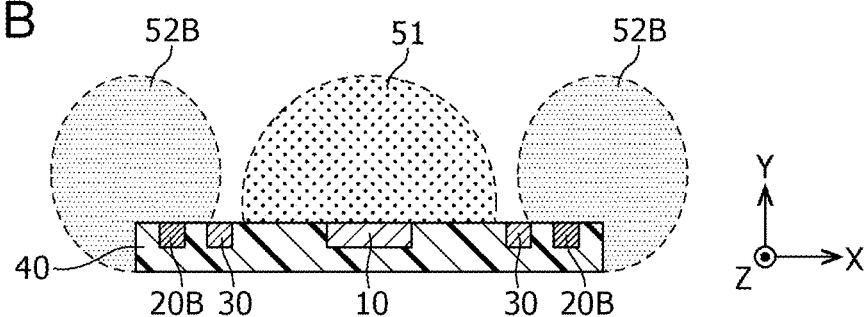
FIG. 16B is a diagram schematically illustrating a distribution of the first detection region and the second detection regions in cross sectional view taken along line XVIB-XVIB of FIG. 16A in the non-contact sensor according to Embodiment 3.
Figure 16C:
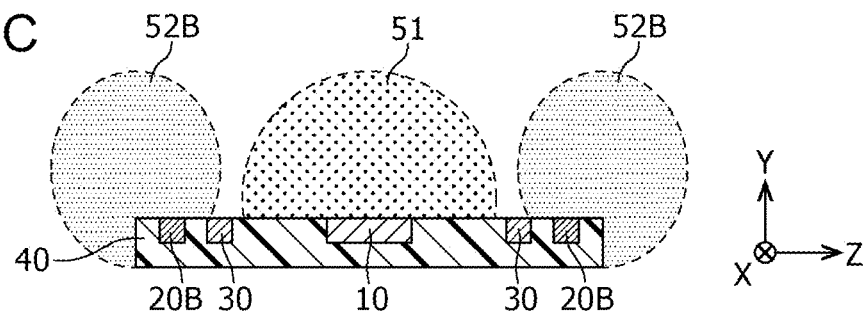
FIG. 16C is a diagram schematically illustrating a distribution of the first detection region and the second detection regions in cross sectional view taken along line XVIC-XVIC of FIG. 16A in the non-contact sensor according to Embodiment 3.

Next, a configuration of a non-contact sensor 1B according to Embodiment 3 is described with reference to FIGS. 15 through 16C. FIG. 15 is a plan view of the non-contact sensor 1B according to Embodiment 3. FIGS. 16A through 16C are diagrams schematically illustrating a distribution of a first detection region 51 and second detection regions 52B in the non-contact sensor 1B. FIG. 16A illustrates the distribution in plan view, FIG. 16B illustrates the distribution in cross sectional view taken along line XVIB-XVIB of FIG. 16A, and FIG. 16C illustrates the distribution in cross sectional view taken along line XVIC-XVIC of FIG. 16A. For easier understanding of a pattern and a positional relationship among a first electrode 10, second electrodes 20B, and a third electrode 30, regions in which the first electrode 10, the second electrodes 20B, and the third electrode 30 are disposed are hatched in FIG. 15.

A difference between the non-contact sensor 1B according to the present embodiment and the non-contact sensor 1 according to Embodiment 1 lies in the number of second electrodes 20B and the shape of the second electrodes 20B. Specifically, in Embodiment 1, a single second electrode 20 is continuously disposed so as to surround the entire peripheries of the first electrode 10 and the third electrode 30. Meanwhile, in the present embodiment, four second electrodes 20B are disposed so as to partially surround the peripheries of the first electrode 10 and the third electrode 30.

Specifically, the four second electrodes 20B intermittently surround the entire peripheries of the first electrode 10 and the third electrode 30 in plan view, as illustrated in FIG. 15. More specifically, the four second electrodes 20B that are parallel with respective four sides of the third electrode 30 having a rectangular frame shape are disposed so as to surround the third electrode 30. That is, the second electrodes 20B according to the present embodiment have a shape obtained by removing four corners of the second electrode 20 according to Embodiment 1.

As described above, in the present embodiment, the four second electrodes 20B intermittently surround the entire periphery of the first electrode 10. Accordingly, in plan view, the second detection regions 52B where a target can be detected by the second electrodes 20B intermittently surround the entire periphery of the first detection region 51 where a target can be detected by the first electrode 10, as illustrated in FIG. 16A.

In cross sectional view taken on XY cross section that is a first cross section, a cross section of the first detection region 51 is sandwiched between two cross sections of the second detection regions 52B, as illustrated in FIG. 16B. In cross sectional view taken on YZ cross section that is a second cross section orthogonal to the first cross section, a cross section of the first detection region 51 is sandwiched between two cross sections of the second detection regions 52B, as illustrated in FIG. 16C.

The non-contact sensor 1B according to the present embodiment configured as above is applicable to a non-contact operating switch, as in Embodiment 1. Furthermore, the non-contact sensor 1B according to the present embodiment can detect a target such as a user's hand according to a detection determining algorithm similar to that in Embodiment 1. This makes it possible to produce effects similar to those in Embodiment 1. For example, it is possible to prevent the non-contact sensor 1B from reacting to an operation that is not intended by a user.

As described above, the non-contact sensor 1B according to the present embodiment includes the first electrode 10, the second electrodes 20B that are disposed in at least part of a region on the outer side of the first electrode 10, and the third electrode 30 that is disposed between the first electrode 10 and the second electrodes 20B and is set to an electric potential lower than those of the first electrode 10 and the second electrodes 20B, as in Embodiment 1. The third electrode 30 may be set to a ground electric potential.

This makes it possible to form the first detection region 51 and the second detection regions 52B in each of which a target can be detected, thereby preventing the non-contact sensor 1B from reacting to an operation that is not intended by a user, as in Embodiment 1.

That is, in the present embodiment, effects similar to those in Embodiment 1 can be obtained although the plurality of second detection regions 52B intermittently surround the entire periphery of the first detection region 51 in plan view.

Modification Etc.

A non-contact sensor and a non-contact operating switch according to the present disclosure have been described above on the basis of Embodiments 1 through 3, but the present disclosure is not limited to Embodiments 1 through 3.

Figure 17:
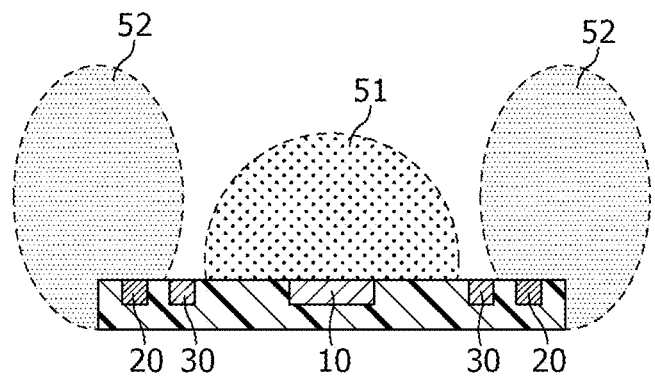
FIG. 17 is a diagram schematically illustrating a distribution of a first detection region and a second detection region in cross sectional view in a non-contact sensor according to Modification 1.

For example, in Embodiment 1, a distance between a surface of the non-contact sensor 1 and a tip of a cross section of the second detection region 52 is the same as that between the surface of the non-contact sensor 1 and a tip of a cross section of the first detection region 51 in cross sectional view. That is, the height of the cross section of the second detection region 52 is the same as that of the cross section of the first detection region 51. However, the present disclosure is not limited to this. As illustrated in FIG. 17, a distance between the surface of the non-contact sensor 1 and the tip of the cross section of the second detection region 52 may be longer than that between the surface of the non-contact sensor 1 and the tip of the cross section of the first detection region 51 in cross sectional view. With this arrangement, when a portion having a large area such as a head or an arm approaches, the second detection region 52 makes contact with this portion earlier than the first detection region 51, and it is therefore possible to make approach of a portion other than a hand ineffective with more certainty. The distance between the surface of the non-contact sensor 1 and the tip of the cross section of the first detection region 51 can be controlled by changing at least one selected from the group of the electric potential of the first electrode 10 and the area of the first electrode 10. The distance between the surface of the non-contact sensor 1 and the tip of the cross section of the second detection region 52 can be controlled by changing at least one selected from the group of the electric potential of the second electrode 20 and the area of the second electrode 20. This applies not only to Embodiment 1, but also to Embodiments 2 and 3.

Figure 18:
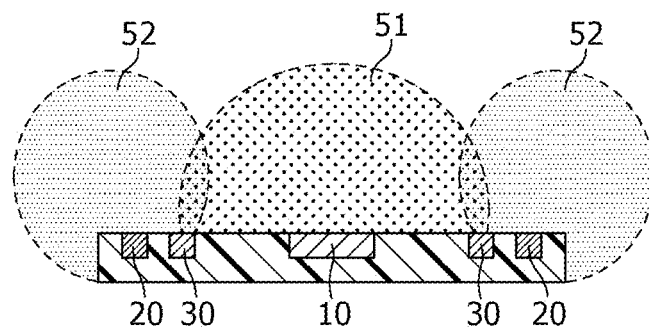
FIG. 18 is a diagram schematically illustrating a distribution of a first detection region and a second detection region in cross sectional view in a non-contact sensor according to Modification 2.

In Embodiment 1, a space that does not belong to the first detection region 51 nor the second detection region 52 exists between the first detection region 51 and the second detection region 52. However, the present disclosure is not limited to this. Specifically, the first detection region 51 and the second detection region 52 may partially overlap each other at a boundary part therebetween, as illustrated in FIG. 18. This applies not only to Embodiment 1, but also to Embodiments 2 and 3.

In addition, various modifications of the embodiments above which a person skilled in the art can conceive of and any combinations of constituent elements and functions in Embodiments 1 through 3 are also encompassed within the present disclosure as long as such modifications and combinations are not deviated from the purpose of the present disclosure.

What is claimed is:
1. A sensor for detecting a target in a non-contact manner, the sensor comprising:
   a first electrode;
   a second electrode;

a third electrode that is disposed between the first electrode and the second electrode; and a determination circuit that, in operation, detects entry of the target into a first region by detecting a change of first electrostatic capacitance, which is electrostatic capacitance of the first electrode, and detects entry of the target into a second region by detecting a change of second electrostatic capacitance, which is electrostatic capacitance of the second electrode, wherein:

an electric potential of the third electrode is more negative than electric potentials of the first electrode and the second electrode, at least a part of the second region at least partially surrounds an outer edge of the first region in plan view, the third electrode surrounds the first electrode in plan view, and the second electrode surrounds the third electrode, and the first electrode, the second electrode and the third electrode are provided on a same plane surface of the sensor.

2. The sensor according to claim 1, wherein the second region continuously and fully surrounds the outer edge of the first region in plan view.

3. The sensor according to claim 2, wherein:

a first cross sectional view cutting the first and second electrodes comprises a first cross section of the first region and two second cross sections of the second region, and the first cross section is located between the two second cross sections; and a second cross sectional view cutting the first and second electrodes and orthogonal to the first cross sectional view comprises a third cross section of the first region and two fourth cross sections of the second region, and the third cross section is located between the two fourth cross sections.

4. The sensor according to claim 1, wherein the second region surrounds a half or more of the outer edge of the first region in plan view.

5. The sensor according to claim 4, wherein a first cross sectional view cutting the first and second electrodes comprises a first cross section of the first region and two second cross sections of the second region, and the first cross section is located between the two second cross sections; and a second cross sectional view cutting the first and second electrodes and orthogonal to the first cross sectional view comprises a third cross section of the first region and a fourth cross section of the second region, and the fourth cross section is located on one side of the third cross section.

6. The sensor according to claim 1, wherein:

a plurality of second electrodes are provided in the sensor, each of the plurality of second electrodes being the second electrode, the determination circuit, in operation, detects entry of the target into a plurality of second regions by detecting a change of electrostatic capacitance of the plurality of second electrodes, each of the plurality of second regions being the second region, and the plurality of second regions surround the outer edge of the first region in plan view.

7. The sensor according to claim 6, wherein a first cross sectional view comprises a first cross section of the first region and two second cross sections of two of the plurality of second regions, and the first cross section is located between and the two second cross sections; and a second cross sectional view taken orthogonal to the first cross section comprises a third cross section of the first region and two fourth cross sections of two of the plurality of second regions, and the third cross section is located between the two fourth cross section.

8. The sensor according to claim 1, wherein the determination circuit generates a detection signal indicating that the target is detected, when the first electrostatic capacitance is larger than a first value and the second electrostatic capacitance is not larger than a second value; and the determination circuit does not generate the detection signal, when the first electrostatic capacitance is larger than the first value and the second electrostatic capacitance is larger than the second value.

9. The sensor according to claim 1, wherein the determination circuit generates a detection signal indicating that the target is detected, when the first electrostatic capacitance is larger than a first value, the second electrostatic capacitance is not larger than a second value, and a ratio of the first electrostatic capacitance to the second electrostatic capacitance is equal to or larger than a third value.

10. The sensor according to claim 1, wherein the determination circuit generates a detection signal indicating that the target is detected, when the first electrostatic capacitance is larger than a first value and a ratio of the first electrostatic capacitance to the second electrostatic capacitance is equal to or larger than a third value.

11. The sensor according to claim 1, wherein a height from a surface of the sensor to a tip of a cross section of the second region is larger than a height from the surface of the sensor to a tip of a cross section of the first region in cross sectional view.

12. The sensor according to claim 1, wherein the electric potential of the third electrode is a ground electric potential.

13. The sensor according to claim 1, wherein the first region and the second region partially overlap each other in plan view.

14. The sensor according to claim 1, wherein the first region and the second region do not overlap.

15. The sensor according to claim 1, wherein the third electrode is disposed closer to the second electrode than the first electrode.

16. A switch for operating an apparatus, comprising:

a sensor that, in operation, detects a target in a non-contact manner; and a controller that, in operation, generates an operation signal for operating the apparatus on basis of a detection signal supplied from the sensor, the sensor including:

a first electrode;

a second electrode;

a third electrode that is disposed between the first electrode and the second electrode; and a determination circuit that, in operation, detects entry of the target into a first region by detecting a change of first electrostatic capacitance, which is electrostatic capacitance of the first electrode, detects entry of the target into a second region by detecting a change of second electrostatic capacitance, which is electrostatic capacitance of the second electrode, and generates the detection signal on basis of the first electrostatic capacitance and the second electrostatic capacitance, wherein:

an electric potential of the third electrode is more negative than electric potentials of the first electrode and the second electrode, at least a part of the second region at least partially surrounds an outer edge of the first region in plan view, the third electrode surrounds the first electrode in plan view, and the second electrode surrounds the third electrode, and the first electrode, the second electrode and the third electrode are provided on a same plane surface of the sensor.

17. A sensor for detecting a target in a non-contact manner, the sensor comprising:

a first electrode;

a second electrode;

a third electrode that is disposed between the first electrode and the second electrode and fully surrounds the first electrode in plan view; and a determination circuit that, in operation, detects entry of the target into a first region by detecting a change of first electrostatic capacitance, which is electrostatic capacitance of the first electrode, and detects entry of the target into a second region by detecting a change of second electrostatic capacitance, which is electrostatic capacitance of the second electrode, wherein:

an electric potential of the third electrode is more negative than electric potentials of the first electrode and the second electrode, the second electrode fully surrounds the third electrode, and the first electrode, the second electrode and the third electrode are provided on a same plane surface of the sensor.

18. The sensor according to claim 17, wherein the first to third electrode are configured such that the second region does not overlap the first region in plan view.

* * * * *